(12) United States Patent
Nishiwaki et al.

(10) Patent No.: US 8,289,020 B2
(45) Date of Patent: Oct. 16, 2012

(54) MAGNETIC SENSOR AND MAGNETIC SENSOR DEVICE

(75) Inventors: Naohiro Nishiwaki, Aichi (JP); Yasuo Takada, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 622 days.

(21) Appl. No.: 12/543,394

(22) Filed: Aug. 18, 2009

(65) Prior Publication Data
US 2010/0045283 A1    Feb. 25, 2010

(30) Foreign Application Priority Data

Aug. 20, 2008  (JP) .................................. 2008-211581

(51) Int. Cl.
*G01R 33/02*  (2006.01)
*G01B 7/30*  (2006.01)

(52) U.S. Cl. .................................. 324/252; 324/207.21
(58) Field of Classification Search .................. 324/252, 324/207.21
See application file for complete search history.

(56) References Cited

FOREIGN PATENT DOCUMENTS
JP  63-163294  6/1988
JP  2008-130314 A  6/2008

OTHER PUBLICATIONS

Office Action dated Mar. 21, 2012 issued in corresponding Japanese application and partial English Translation thereof, PTRF-09069US_JP_OA-1.

*Primary Examiner* — Reena Aurora
(74) *Attorney, Agent, or Firm* — Roberts Mlotkowski Safran & Cole, P.C.

(57) ABSTRACT

A magnetic sensor arranged on a second line forming an angle of 45° at a switched position for switching a state being set up on a first line that projects displacement of center of magnetic field generating means generating a magnetic field.

6 Claims, 14 Drawing Sheets

US 8,289,020 B2

MAGNETIC SENSOR AND MAGNETIC SENSOR DEVICE

The present application is based on Japanese Patent Application No. 2008-211581 filed on Aug. 20, 2008, the entire contents of which are incorporated herein by reference.

BACKGROUND OF THE INVENTION

1. Field of the Invention

The present invention relates to a magnetic sensor and a magnetic sensor device.

2. Related Art

As a conventional technique, a switch device is known which includes a casing, an inner rotor rotatably provided with respect to the casing and including a magnetic plate having a circular shape in which a north pole, a south pole and a north pole are magnetized in this order, and a Hall IC (Integrated Circuit) provided on a substrate facing the magnetic plate (e.g., JP-A 2008-130314).

According to this switch device, the magnetic plate also rotates in accordance with rotation of the inner rotor, and the Hall IC can output ON and OFF signals based on a variation of a magnetic field caused by the rotation.

However, in a conventional switch device, there is a problem that a revision of the arrangement of the Hall IC or of a related electronic circuit, etc., is required for changing a switched position of ON and OFF signals depending on the application, which results in a complicated design.

THE SUMMARY OF THE INVENTION

Therefore, it is an object of the invention to provide a magnetic sensor and a magnetic sensor device in which it is possible to easily set a switched position and a distance between the switched positions depending on the application without making the design complicated.

[1] According to a feature of the present invention, a magnetic sensor arranged on a second line forming an angle of 45° at a switched position for switching a state being set up on a first line that projects displacement of center of magnetic field generating means generating a magnetic field.

[2] In the magnetic sensor described in above-mentioned [1], the magnetic sensor comprises four magnetoresistance elements comprising magnetic sensing portions; and when the magnetic field generating means is located at a position where an angle formed between the first line and a third line connecting the center of the magnetic field generating means on the first line to a center of the magnetic sensor is 90°, a first half-bridge circuit is composed of a first magnetoresistance element having the magnetic sensing portions parallel to a magnetic field direction and a second magnetoresistance element having the vertical magnetic sensing portions, and a full bridge-circuit is composed of the first half-bridge circuit and a second half-bridge circuit that is the 180 degrees rotated first half-bridge circuit.

[3] In the magnetic sensor described in above-mentioned [1], the magnetic field generating means is a permanent magnet having a circular cylindrical shape for radially generating the magnetic field.

[4] In the magnetic sensor described in above-mentioned [1], another magnetic sensor having the same structure is provided at a position axisymmetric with respect to the first line.

[5] According to a feature of the present invention, a magnetic sensor device, comprising:

a magnet field generating means for generating a magnet field; and a magnetic sensor portion comprising second lines each forming an angle of 45° at at least one switched position for switching a plurality of states being set up on a first line that projects displacement of center of magnetic field generating means, and at least one magnetic sensor arranged on each of the second line.

[6] In the magnetic sensor device described in above-mentioned [5], the at least one magnetic sensor comprises four magnetoresistance elements each having magnetic sensing portions; and when the magnetic field generating means is located at a position where an angle formed between the first line and a third line connecting the center of the magnetic field generating means on the first line to a center of the magnetic sensor is 90°, a first half-bridge circuit is composed of a first magnetoresistance element having the magnetic sensing portions parallel to a magnetic field direction and a second magnetoresistance element having the vertical magnetic sensing portions, and a full bridge-circuit is composed of the first half-bridge circuit and a second half-bridge circuit that is the 180 degrees rotated first half-bridge circuit.

[7] In the magnetic sensor device described in above-mentioned [5], the at least one magnetic sensor is each arranged at an equal distance from the first line.

[8] In the magnetic sensor device described in above-mentioned [5], the magnetic field generating means is a permanent magnet having a circular cylindrical shape for radially generating the magnetic field.

[9] In the magnetic sensor device described in above-mentioned [5], the magnetic sensor portion comprises a magnetic sensor having the same structure and the same number as the at least one magnetic sensor at a position axisymmetric with respect to the first line.

[10] According to a feature of the present invention, a magnetic sensor device, comprising:

a magnet field generating means for generating a magnet field;

a magnetic sensor portion comprising second lines each forming an angle of 45° at at least one switched position for switching a plurality of states being set up on a first line that projects displacement of center of magnetic field generating means, and at least one magnetic sensor arranged on each of the second line; and a judgment portion for judging each state based on at least one output signal output from the at least one magnetic sensor, and then judging the plurality of states based on a combination of the each state.

EFFECT OF THE INVENTION

According to the invention, it is possible to easily set a switched position and a distance between the switched positions depending on the application without making the design complicated.

BRIEF DESCRIPTION OF THE DRAWINGS

Next, the present invention will be explained in more detail in conjunction with appended drawings, wherein.

DESCRIPTION OF THE PREFERRED EMBODIMENTS

Next, preferred embodiments of the magnetic sensor and the magnetic sensor device according to the present invention will be explained in detail in conjunction with appended drawings.

First Embodiment

Structure of Switch Device

Figure 1:
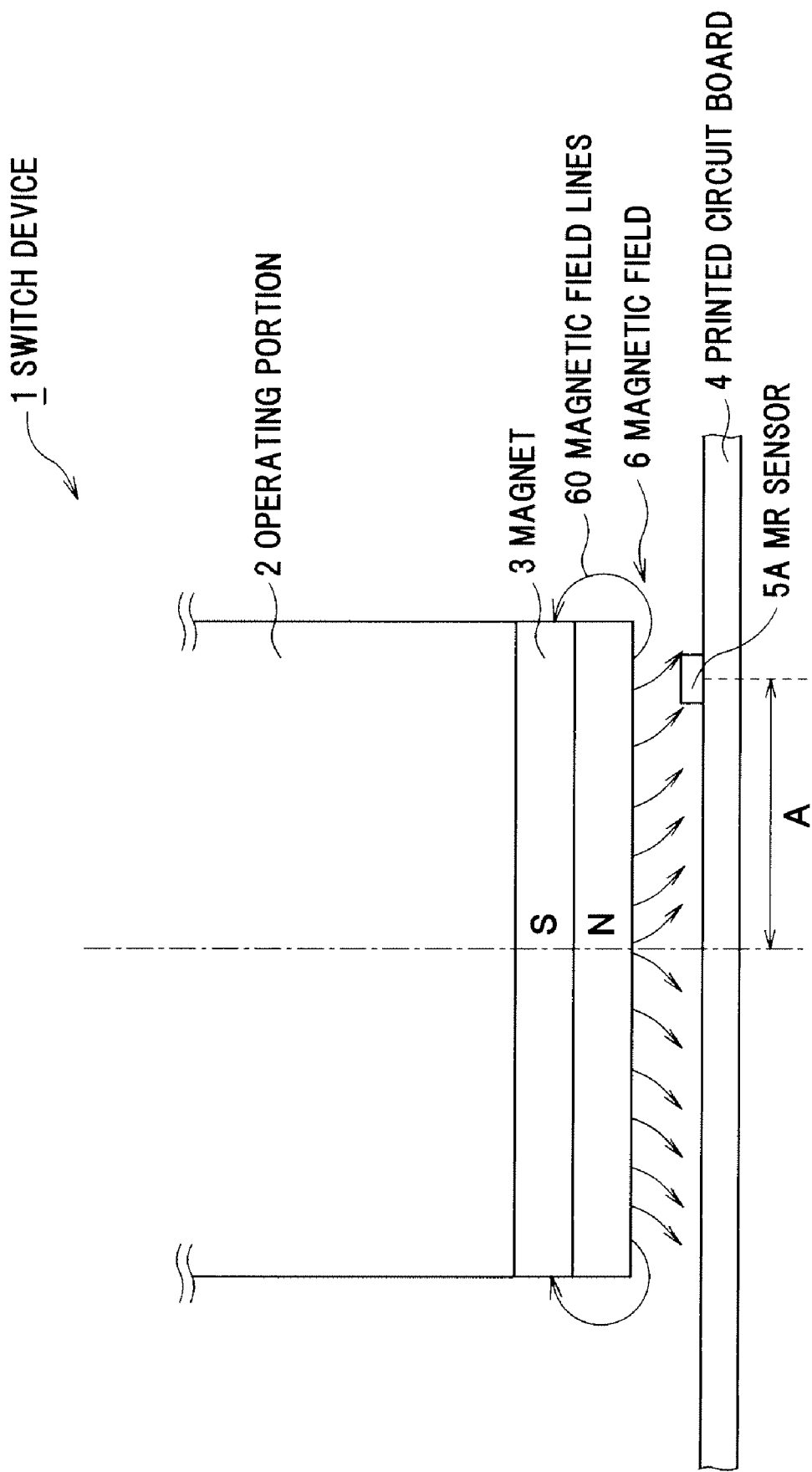
FIG. 1 is a schematic view showing a switch device in a first preferred embodiment of the present invention.

FIG. 1 is a schematic view showing a switch device in a first embodiment of the invention. It will be explained that a magnetic sensor and a magnetic device of the invention is used as a switch device.

A switch device 1 is, as an example, a switch for switching a state of a below-described controlled device mounted on a vehicle, and as shown in FIG. 1, the switch device 1 is schematically configured to include an operating portion 2, a magnet (magnetic field generating means) 3, a printed circuit board 4, and an MR (a magnetic sensor; Magneto-Resistance) sensor 5A. The state here means, e.g., on/off of a certain function and shift-up and -down of a shift device, and the detail thereof depends on the controlled device.

Structure of Operating Portion

The operating portion 2 is, e.g., supported by a non-illustrated heretofore known support mechanism so as to be operable at an operating position on a single axis. The single axis here indicates a trajectory, projected on the printed circuit board 4, of a center of the magnet 3 which is displaced by an operation of the operating portion 2.

In addition, as shown in FIG. 1, the operating portion 2 is provided with the magnet 3 at an end portion thereof facing the printed circuit board 4.

Structure of Magnet

The magnet 3 is formed of, e.g., a ferrite magnet or a neodymium magnet, etc., and is a permanent magnet having a circular cylindrical shape which radially generates a magnetic field 6, and as shown in FIG. 1, the magnet 3 is magnetized in a vertical direction using a side facing the printed circuit board 4 as a north pole, and generates the magnetic field 6 as indicated by magnetic field lines 60 from a north pole to a south pole.

Figure 2:
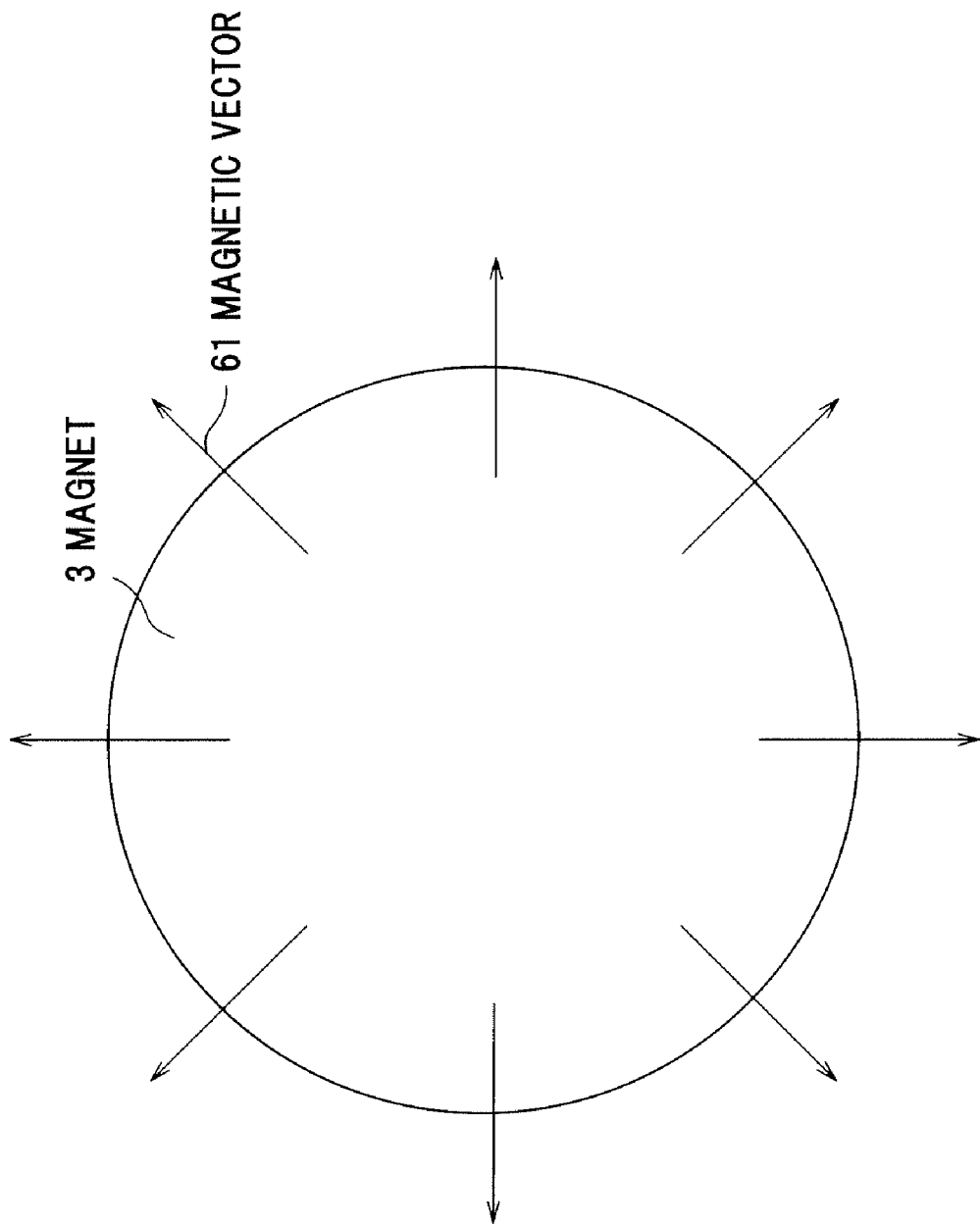
FIG. 2 is a schematic view related to a magnetic vector in the first embodiment of the invention.

FIG. 2 is a schematic view related to a magnetic vector in the first embodiment of the invention. FIG. 2 shows an overview of the magnet 3 when viewed from the top. As shown in FIG. 2, the magnet 3 radially generates the magnetic field 6 from the center thereof toward an outer periphery. In addition, a direction and magnitude of the magnetic field 6 in a plane formed by a below-described magnetic sensing portion of the MR sensor 5A are indicated as magnetic vectors 61 in FIG. 2.

Structure of MR Sensor

Figure 3:
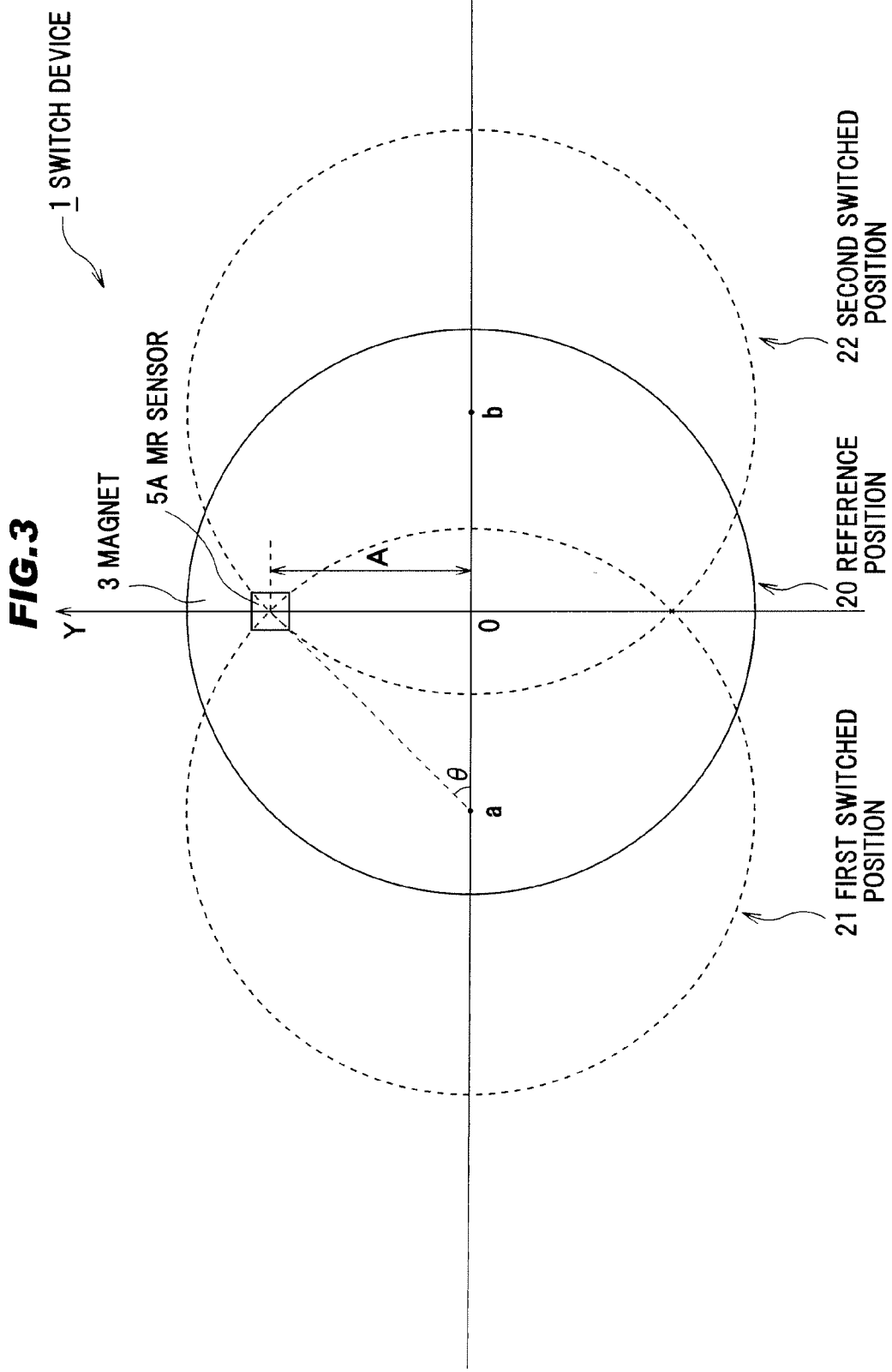
FIG. 3 is a schematic view showing a positional relation between a switched position and an MR sensor in the first embodiment of the invention.

FIG. 3 is a schematic view showing a positional relation between a switched position and an MR sensor in the first embodiment of the invention. In FIG. 3, an axis on which displacement of center of the magnet 3 is projected is an X-axis (a first line), an axis perpendicular to the X-axis is a Y-axis and an origin coincides with a point which is a projected center of the magnet 3 when the magnet 3 is located at a reference position. In addition, a position a shows a point which is a projected center of the magnet 3 when the magnet 3 is located at a first switched position 21, and a position b shows a point which is a projected center of the magnet 3 when the magnet 3 is located at a second switched position 22. Distances from the origin to the positions a and b on the X-axis are equal, and the point which is the center of the magnet 3 projected on the X-axis moves on the X-axis.

As shown in FIG. 3, the center of the MR sensor 5A is arrange on the Y-axis separating a distance A from the X-axis. In addition, the MR sensor 5A is arranged so that an angle θ formed by the center of the MR sensor 5A and the position a at the first switched position 21 is 45°.

In other words, when a state is switched from a certain state to another certain state at the portion a by operating the operating portion 2, the MR sensor 5A is arranged at a position on a line passing through the position a on the X-axis and forming an angle of 45° with the X-axis (a second line) for reasons as described below. Therefore, in this case, the distance from the origin to the position a on the X-axis is equal to the distance A shown in FIG. 3.

Figure 4:
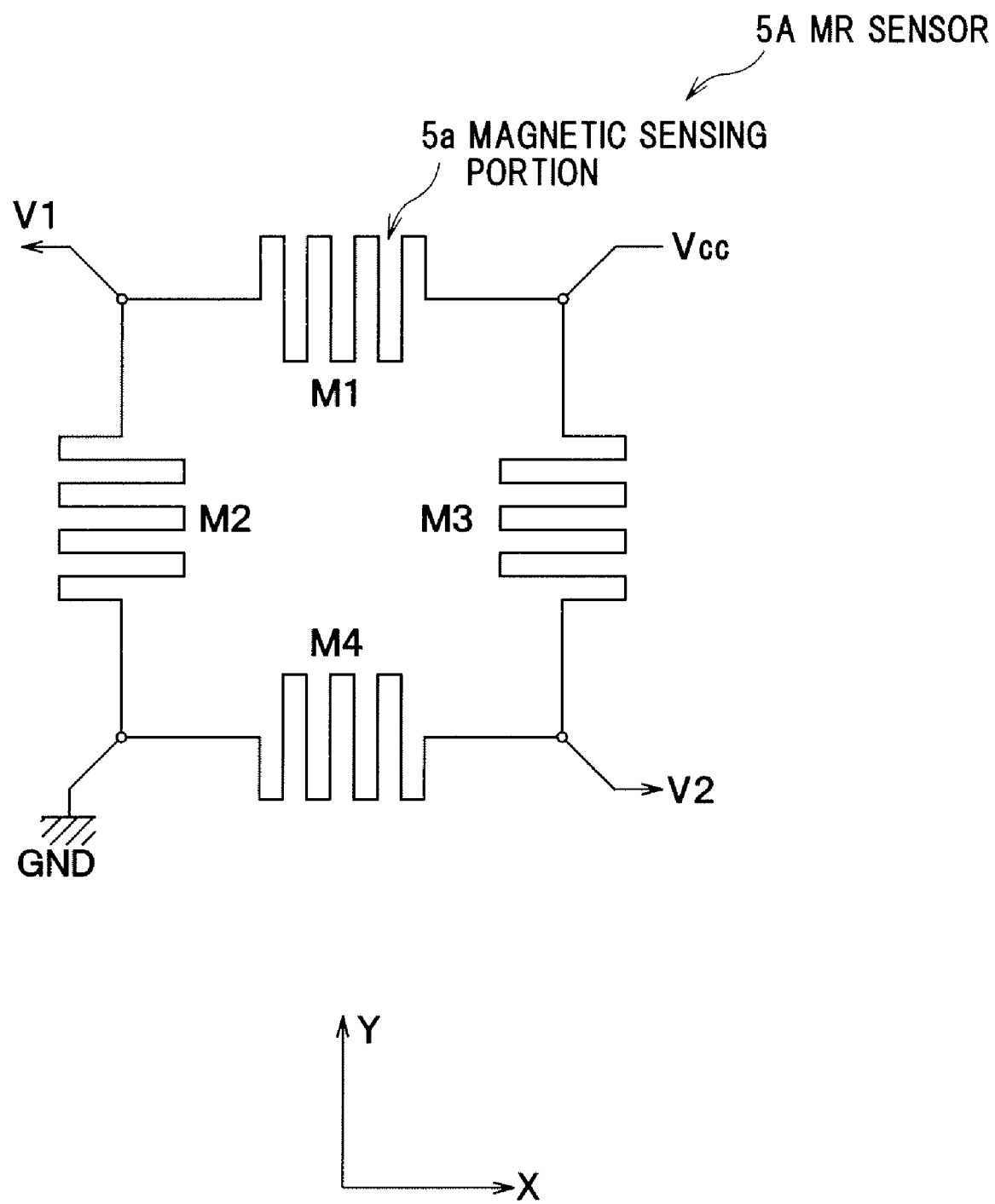
FIG. 4 is an equivalent circuit diagram showing the MR sensor in the first embodiment of the invention.

FIG. 4 is an equivalent circuit diagram showing the MR sensor in the first embodiment of the invention. As shown in FIG. 4, the MR sensor 5A is composed of magnetoresistance elements M1 to M4 which output a variation of the magnetic field 6 as a variation of voltage, and the magnetoresistance elements M1 to M4 have a shape such that the magnetic sensing portions 5a are replicated in an accordion-like manner.

A magnetic sensing portion 5a has a physicality that a magnetoresistance value thereof varies based on an acting direction of the magnetic field 6, i.e., a variation of a direction of the magnetic vector 61 on a plane formed by the magnetic sensing portion 5a, and is formed of, e.g., a ferromagnetic substance such as NiFe permalloy and FeCo alloy, etc., which are formed in a form of a thin film.

As shown in FIG. 4, in the MR sensor 5A, applied voltage Vcc is applied between the magnetoresistance elements M1 and M3, and a intermediate point between the magnetoresistance elements M2 and M4 is electrically connected to a ground circuit of the printed circuit board 4.

In addition, the MR sensor 5A is configured to output midpoint potential between the magnetoresistance elements M1 and M2 as output voltage V1 and to output midpoint potential between the magnetoresistance elements M3 and M4 as output voltage V2.

The magnetic sensing portion 5a of the magnetoresistance element M1 is 90° different from the magnetic sensing direction thereof, and in the MR sensor 5A, a first half-bridge circuit is formed by the magnetoresistance elements M1 and M2 and a second half-bridge circuit is formed by the magnetoresistance elements M3 and M4 which is a 180 degrees rotated first half-bridge circuit. In the MR sensor 5A, a full bridge-circuit is formed by the first and second half-bridge circuits.

Control Portion

Figure 5:
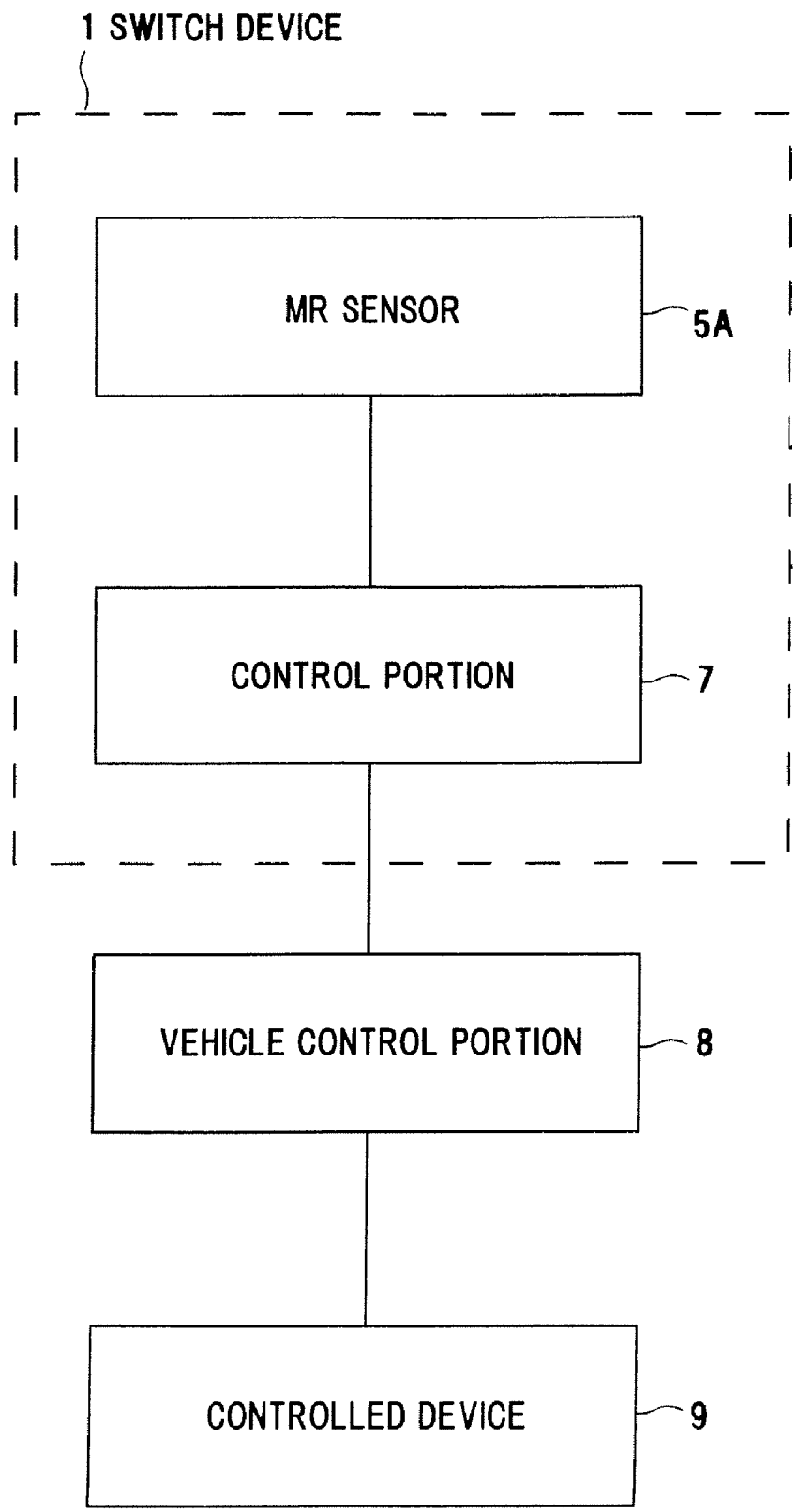
FIG. 5 is a block diagram related to the switch device in the first embodiment of the invention.

FIG. 5 is a block diagram related to the switch device in the first embodiment of the invention. The switch device 1 has, e.g., a control portion 7 for judging two states of Hi and Lo based on an output signal which is output from the MR sensor 5A, the control portion 7 is connected to a vehicle control portion 8 and the vehicle control portion 8 is connected to a controlled device 9.

In addition, the control portion 7 calculates, e.g., a difference value between the output voltages V1 and V2 which are output from the MR sensor 5A (=V1−V2), and judges Hi or Lo based on the calculated difference value (a below-described first output signal). It should be noted that the control portion 7 may be circuit-integrated with the MR sensor 5A or may be configured to switch the Hi and Lo states using the vehicle control portion 8 by inputting the output from the MR sensor 5A to the vehicle control portion 8, and it is not limited thereto.

The controlled device 9 is, as an example, an electronic device such as a shift device, a wiper system or an indicator system, etc., which are mounted on a vehicle, and is switched to two states of Hi and Lo based on the operating position of the operating portion 2.

Motion in the First Embodiment

Motions of the switch device in the present embodiment will be explained in detail hereinafter in conjunction with each drawing. It will be explained that the magnet 3 is operated to a first switched position, to a reference position and to a second switched position via the operating portion 2.

Operation in an Initial Position

Figure 6A:
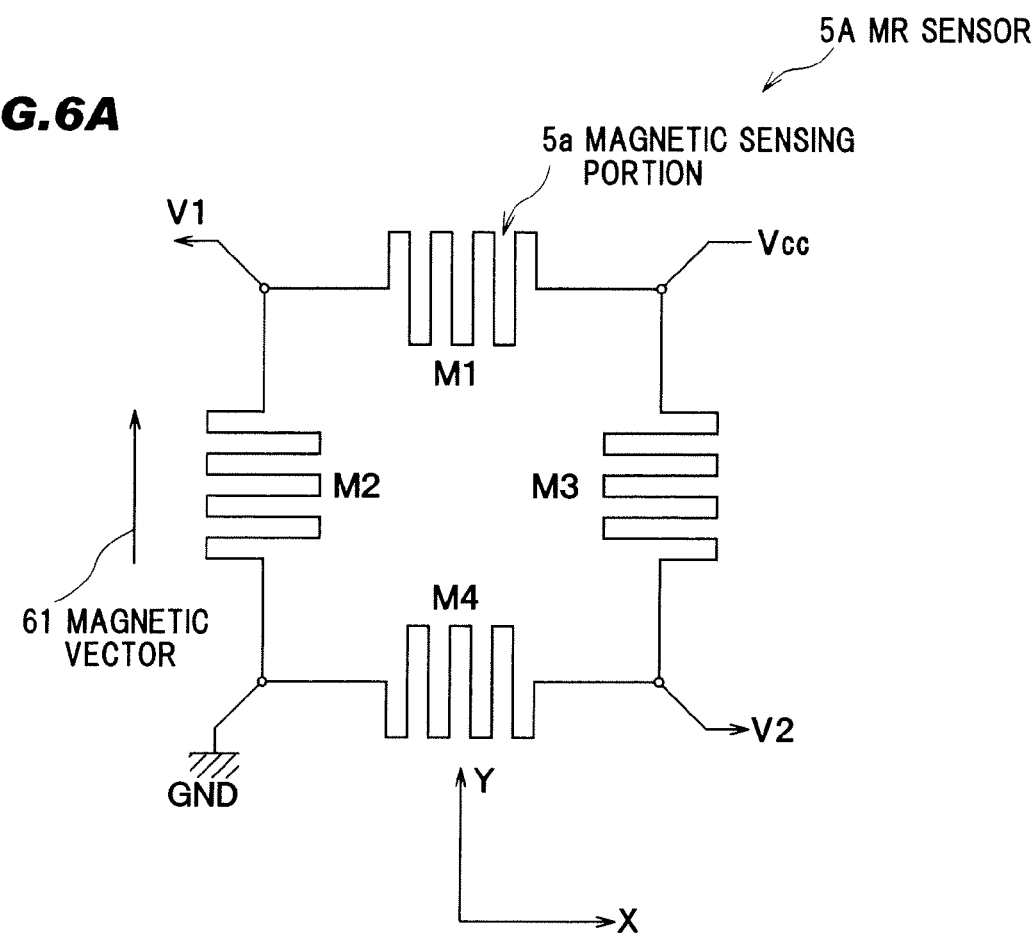
FIG. 6A is an equivalent circuit diagram showing the MR sensor in the first embodiment of the invention when a magnet is located at a reference position.
Figure 6B:
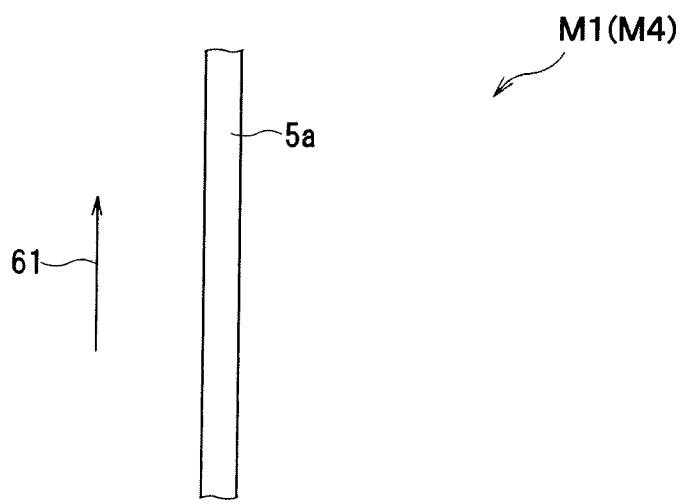
FIG. 6B is a schematic view showing a magnetic sensing portion of magnetoresistance elements M1 and M4.
Figure 6C:
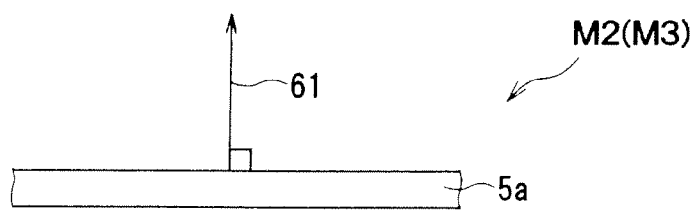
FIG. 6C is a schematic view showing a magnetic sensing portion of magnetoresistance elements M2 and M3.

FIG. 6A is an equivalent circuit diagram showing the MR sensor in the first embodiment of the invention when a magnet is located at a reference position, FIG. 6B is a schematic view showing a magnetic sensing portion of magnetoresistance elements M1 and M4, and FIG. 6C is a schematic view showing a magnetic sensing portion of magnetoresistance elements M2 and M3. In the following explanation, as an example, the applied voltage Vcc is 2.6 v, the first switched position 21 is −5 mm, and the second switched position 22 is +5 mm. Firstly, it will be explained that the operating portion 2 is located at a reference position 20 shown in FIG. 3.

When the operating portion 2 is located at the reference position 20, since the magnetic vector 61 parallel to the magnetic sensing portion 5a acts on the magnetoresistance elements M1 and M4 as shown in FIG. 6, a magnetoresistance value thereof becomes a maximum value.

In addition, as shown in FIG. 6C, since the magnetic vector 61 perpendicular to the magnetic sensing portion 5a acts on the magnetoresistance elements M2 and M3, the magnetoresistance value thereof becomes a minimum value.

The MR sensor 5A outputs the output voltages V1 and V2 to the control portion 7 and the control portion 7 calculates a first output signal based on the output voltages V1 and V2. The output voltages V1 and V2 are values which are determined by a ratio of the magnetoresistance value of the magnetoresistance elements M1 to M4, and since the magnetoresistance value of the magnetoresistance element M2 is less than that of the magnetoresistance element M4, the first output signal (=V1−V2) has a negative value.

Operation in the First Switched Position

Figure 7A:
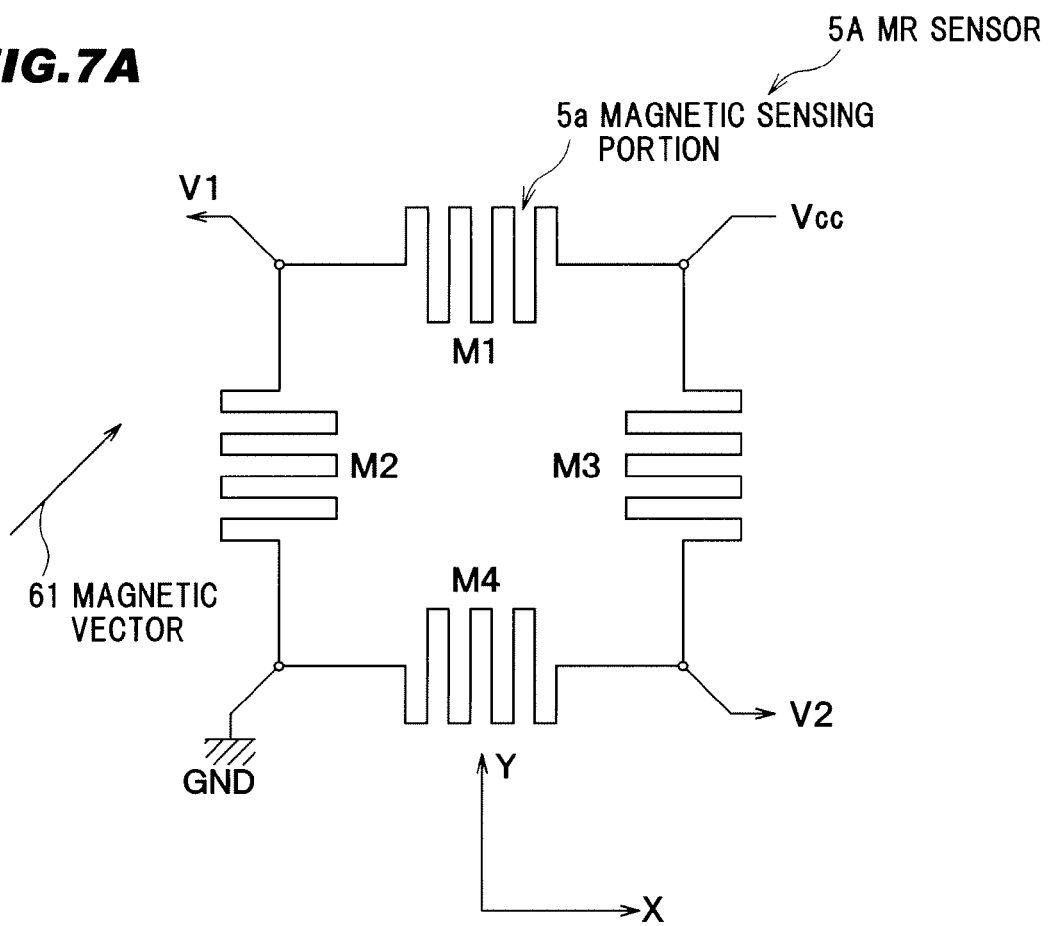
FIG. 7A is an equivalent circuit diagram showing the MR sensor in the first embodiment of the invention when a magnet is located at a first switched position.
Figure 7B:
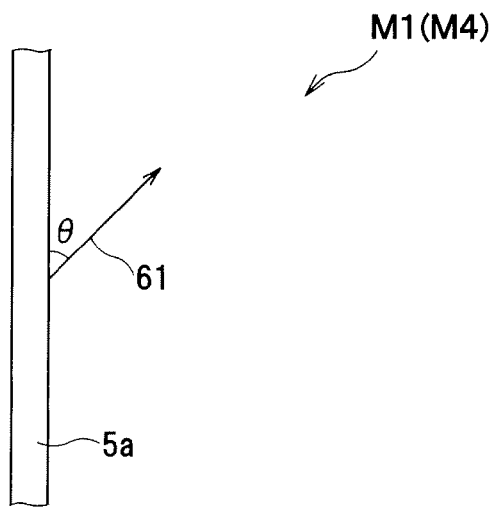
FIG. 7B is a schematic view showing a magnetic sensing portion of magnetoresistance elements M1 and M4.
Figure 7C:
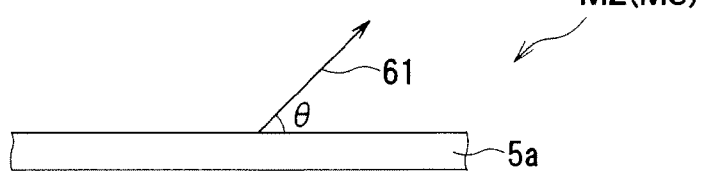
FIG. 7C is a schematic view showing a magnetic sensing portion of magnetoresistance elements M2 and M3.

FIG. 7A is an equivalent circuit diagram showing the MR sensor in the first embodiment of the invention when a magnet is located at a first switched position, FIG. 7B is a schematic view showing a magnetic sensing portion of magnetoresistance elements M1 and M4, and FIG. 7C is a schematic view showing a magnetic sensing portion of magnetoresistance elements M2 and M3. Since the distance from the origin to the position a is equivalent to the distance A, the angle θ shown in FIGS. 7B and 7C is 45°.

When the operating portion 2 is located at the first switched position 21, since the magnetic vector 61 acts on the magnetoresistance elements M1 and M4 at an angle of 45° with respect to the magnetic sensing portion 5a as shown in FIG. 7B and the magnetic vector 61 acts on the magnetoresistance elements M2 and M3 at an angle of 45° with respect to the magnetic sensing portion 5a as shown in FIG. 7C, the magnetoresistance values are the same for the magnetoresistance elements M1 to M4.

The MR sensor 5A outputs the output voltages V1 and V2 to the control portion 7 and the control portion 7 calculates a first output signal based on the output voltages V1 and V2. Since the magnetoresistance values of the magnetoresistance elements M1 to M4 are the same value, the first output signal (=V1−V2) has a zero value.

Operation in the Second Switched Portion

Figure 8A:
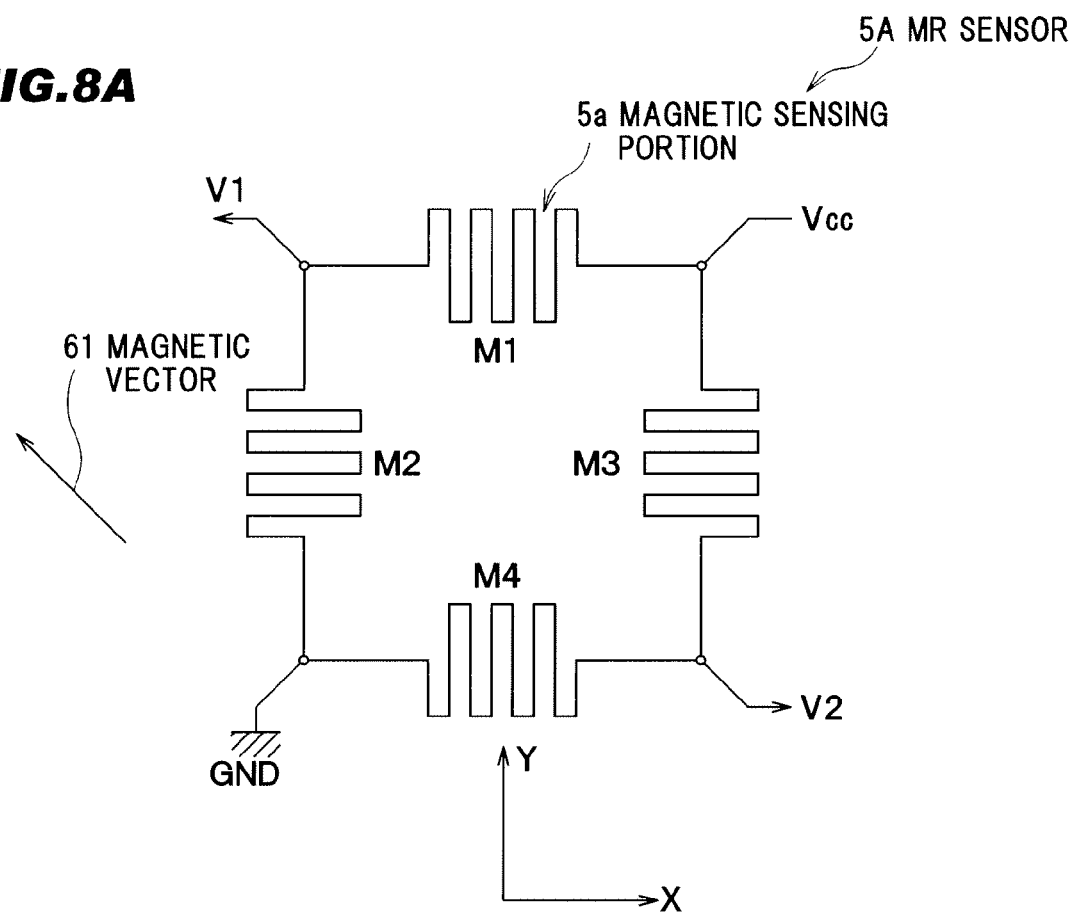
FIG. 8A is an equivalent circuit diagram showing the MR sensor in the first embodiment of the invention when a magnet is located at a second switched position.
Figure 8B:
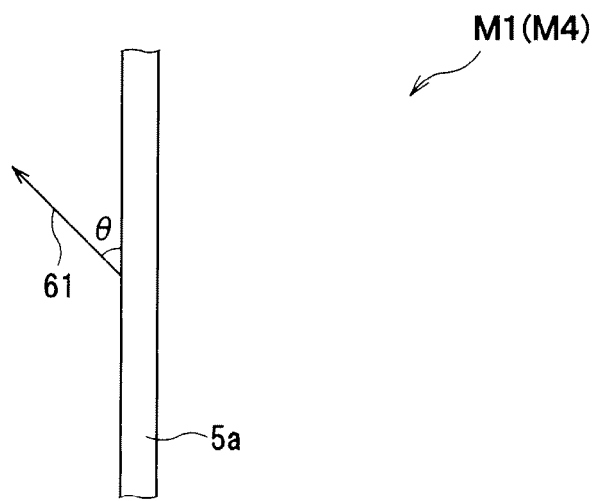
FIG. 8B is a schematic view showing a magnetic sensing portion of magnetoresistance elements M1 and M4.
Figure 8C:
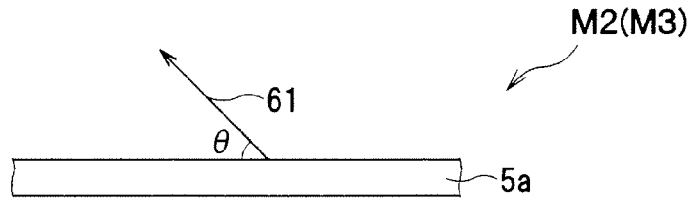
FIG. 8C is a schematic view showing a magnetic sensing portion of magnetoresistance elements M2 and M3.

FIG. 8A is an equivalent circuit diagram showing the MR sensor in the first embodiment of the invention when a magnet is located at a second switched position, FIG. 8B is a schematic view showing a magnetic sensing portion of magnetoresistance elements M1 and M4, and FIG. 8C is a schematic view showing a magnetic sensing portion of magnetoresistance elements M2 and M3. The angle θ shown in FIGS. 8B and 8C is 45° for the same reason as the above.

When the operating portion 2 is located at the second switched position 22, since the magnetic vector 61 acts on the magnetoresistance elements M1 and M4 at an angle of 45° with respect to the magnetic sensing portion 5a as shown in FIG. 8B and the magnetic vector 61 acts on the magnetoresistance elements M2 and M3 at an angle of 45° with respect to the magnetic sensing portion 5a as shown in FIG. 8C, the magnetoresistance values are the same for the magnetoresistance elements M1 to M4.

The MR sensor 5A outputs the output voltages V1 and V2 to the control portion 7 and the control portion 7 calculates a first output signal based on the output voltages V1 and V2.

Since the magnetoresistance values of the magnetoresistance elements M1 to M4 are the same value, the first output signal (=V1−V2) has a zero value.

Figure 9:
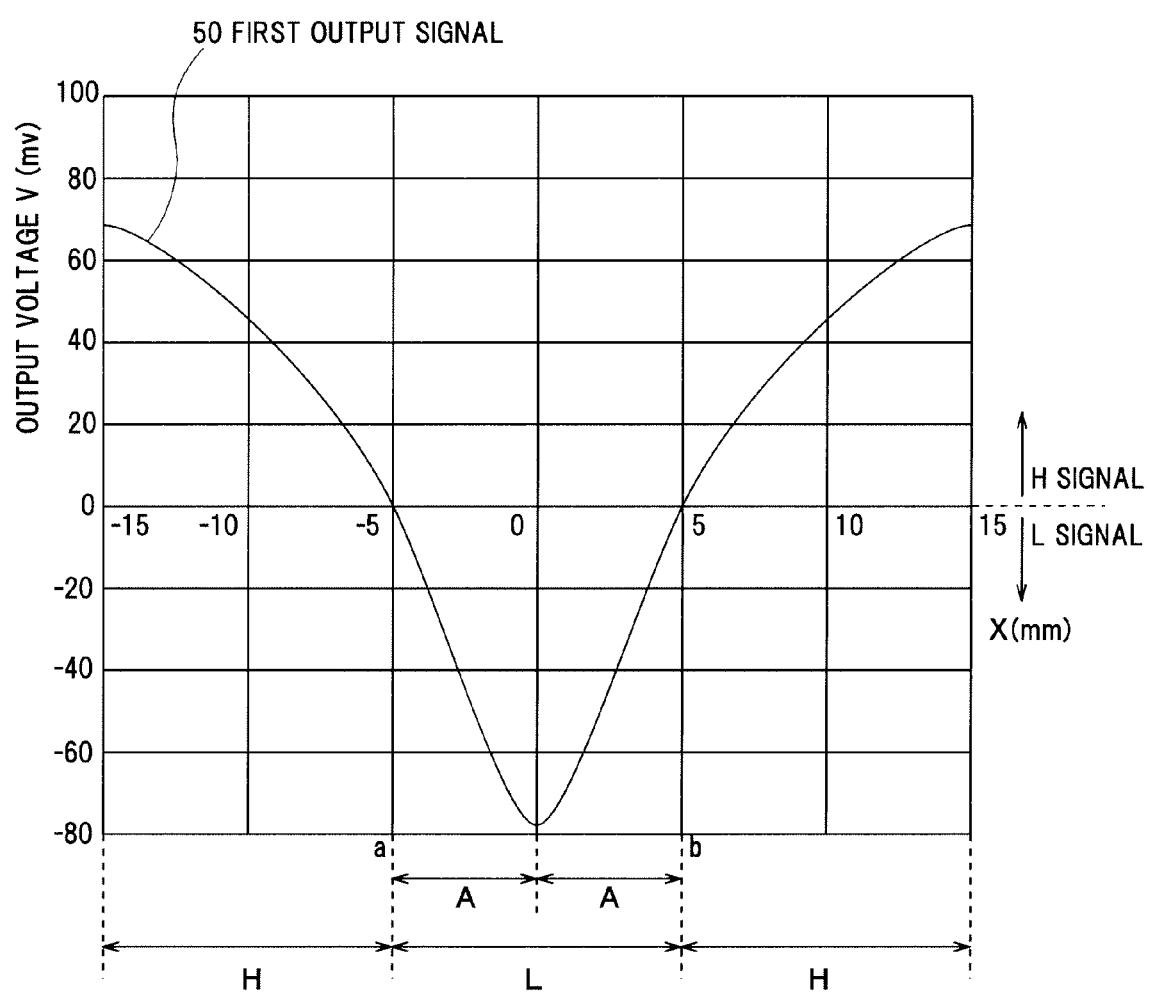
FIG. 9 is a graph showing a relation between calculated output voltage V and a position on an X-axis in the first embodiment of the invention.

FIG. 9 is a graph showing a relation between calculated output voltage V and a position on an X-axis in the first embodiment of the invention.

As shown in FIG. 9, a calculated first output signal 50 has a minimum value (a negative value) at the reference position 20, and has zero at the first switched position 21 and the second switched position 22.

Therefore, as shown in FIG. 9, the control portion 7 judges as Lo when output voltage V≦0 mv and then outputs an L signal to the vehicle control portion 8, and judges as Hi when 0 mv<the output voltage mv and then outputs an H signal to the vehicle control portion 8.

At this time, as shown in FIG. 9, a switching position of H and L is at a distance of ±5 mm on the X-axis, and the arrangement of the MR sensor 5A can be easily determined based on the switching position of H and L.

In addition, although the MR sensor 5A is arranged on the Y-axis in the present embodiment, for example, when the switch device 1 requires on/off switching, i.e., when on/off is switched at the first switched position 21, it is possible to easily realize a switched position depending on the application without making the design complicated by arranging the center thereof on a line passing through a position a on the X-axis and forming an angle of 45°.

Effect of the First Embodiment (1) According to the above-mentioned switch device 1 in the first embodiment, it is possible to determine the arrangement of the MR sensor 5A based on a switched position of Hi and Lo.

(2) According to the above-mentioned switch device 1 in the first embodiment, since the magnetoresistance elements M1 to M4 are arranged so as to output the output voltages V1 and V2 of which a difference value (the first output signal 50) becomes zero at the first switched position 21 and the second switched position 22, the design is facilitated and it is thereby possible to reduce the cost.

(3) According to the above-mentioned switch device 1 in the first embodiment, it is possible to accurately judge the two operating position of Hi and Lo.

(4) According to the above-mentioned switch device 1 in the first embodiment, since the magnet 3 is used as magnetic field generating means, the structure is simplified, in addition, the radial magnetic field 6 is easily generated, and it is thereby possible to reduce the cost.

It should be noted that the angle θ is 45° based on the arrangement of the magnetoresistance elements M1 to M4 of the MR sensor 5A, however, it is not limited thereto, and the arrangement of the magnetoresistance elements M1 to M4 may be rotated based on the angle θ for setting the switched position.

Second Embodiment

Structure of Switch Device

Figure 10:
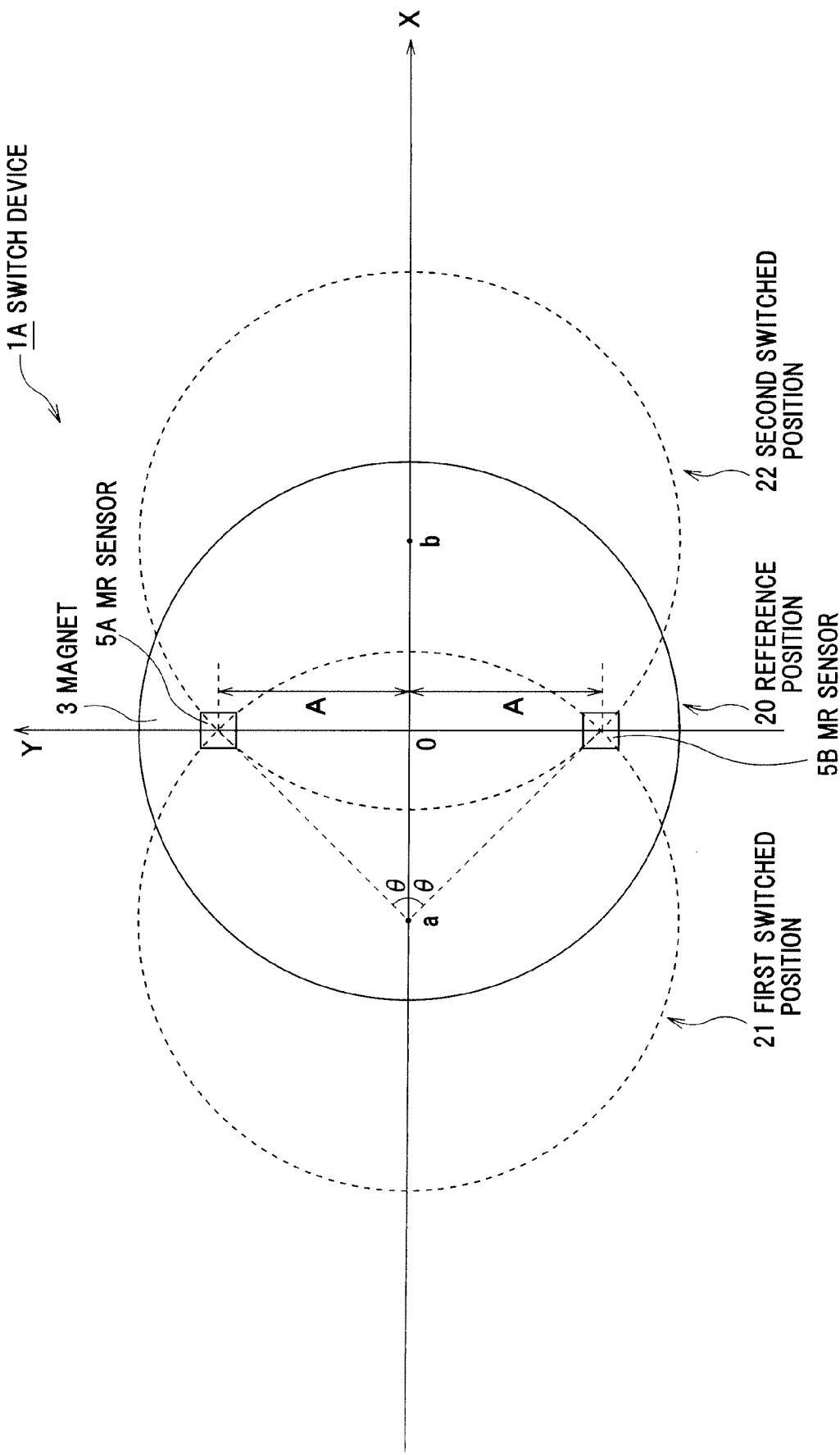
FIG. 10 is a schematic view showing a positional relation between a switched position and an MR sensor in a second embodiment of the invention.

FIG. 10 is a schematic view showing a positional relation between a switched position and an MR sensor in a second embodiment of the invention. A switch device 1A of the present embodiment is the switch device 1 with a MR sensor 5B added thereto. It should be noted that common reference numerals are given to portions having the same structure and the same functions as the first embodiment.

As shown in FIG. 10, the MR sensor 5B is arranged at an axisymmetric position of the MR sensor 5A with respect to the X-axis.

The MR sensor 5B has the same structure as the MR sensor 5A, and is configured to output the same output voltage as that of the MR sensor 5A to the control portion 7 based on a position of the magnet 3.

The control portion 7 calculates a difference value based on the output voltage of the MR sensor 5B in the same manner as the first embodiment, and the calculated difference value draws the same curved line as the first output signal 50 shown in FIG. 9.

Motion in the Second Embodiment

The control portion 7 calculates a difference value based on the output voltages output from the MR sensors 5A or 5B. As an example, when the output voltage is not output from either the MR sensors 5A and 5B, or, when the largely different output voltages are output, the control portion 7 judges that an abnormality occurs and a signal indicating the abnormality is output to the vehicle control portion 8, then, the vehicle control portion 8 stops controlling the controlled device 9 and alerts the abnormality to the outside.

In addition, the control portion 7 may, e.g., alerts the abnormality and continue the operation based on the MR sensor 5A or 5B which still functions well, and it is not limited thereto.

Effect of the Second Embodiment (1) According to the above-mentioned switch device 1A in the second embodiment, since, when the abnormality occurs either in the MR sensor 5A or 5B, it is possible to promptly judge the abnormality and to alert it to the outside, it is possible to prevent malfunction due to the abnormality.

Third Embodiment

Structure of Switch Device

Figure 11:
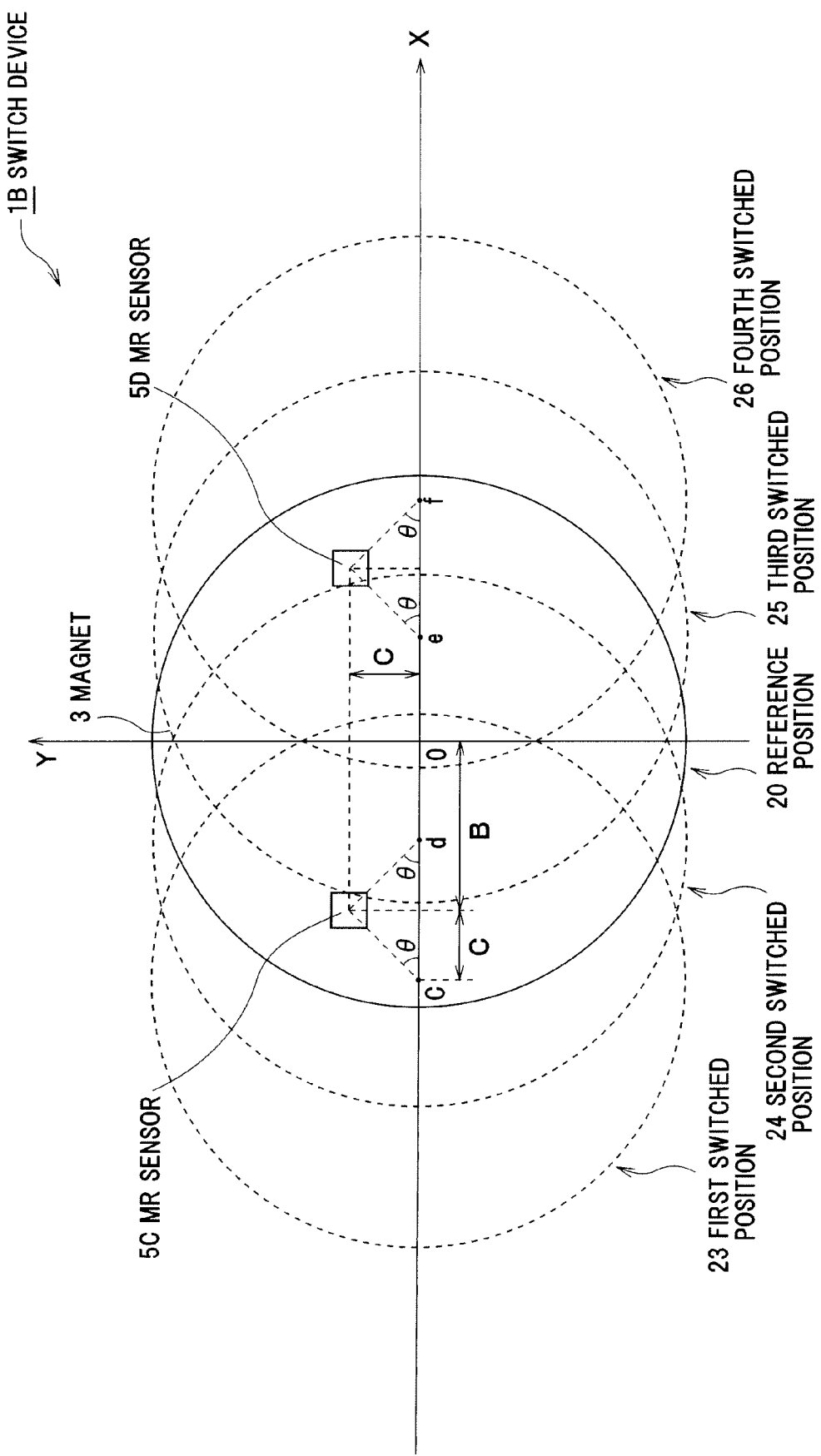
FIG. 11 is a schematic view showing a positional relation between a switched position and an MR sensor in a third embodiment of the invention.

FIG. 11 is a schematic view showing a positional relation between a switched position and an MR sensor in a third embodiment of the invention. As shown in FIG. 11, a switch device 1B in the present embodiment is provided with two magnetic sensors, which are MR sensors 5C and 5D, and also provided with first to fourth switched positions 23-26 (positions c to f).

The MR sensor 5C has the same structure as the MR sensor 5A in the first embodiment, and as shown in FIG. 11, the MR sensor 5C is arranged at a position separated a distance B from the Y-axis (a negative region of the X-axis) and a distance C from the X-axis (a positive region of the Y-axis). Distances from the origin to the positions c and f are the same, and distances from the origin to the positions d and e are the same.

The MR sensor 5D is configured in the same manner as the MR sensor 5C, and as shown in FIG. 11, the MR sensor 5D is arranged at an axisymmetric position of the MR sensor 5C with respect to the Y-axis.

The MR sensors 5C and 5D output the output voltages to the control portion 7 and the control portion 7 calculates the above-mentioned difference value for each of the MR sensors 5C and 5D.

Motion in the Third Embodiment

Figure 12:
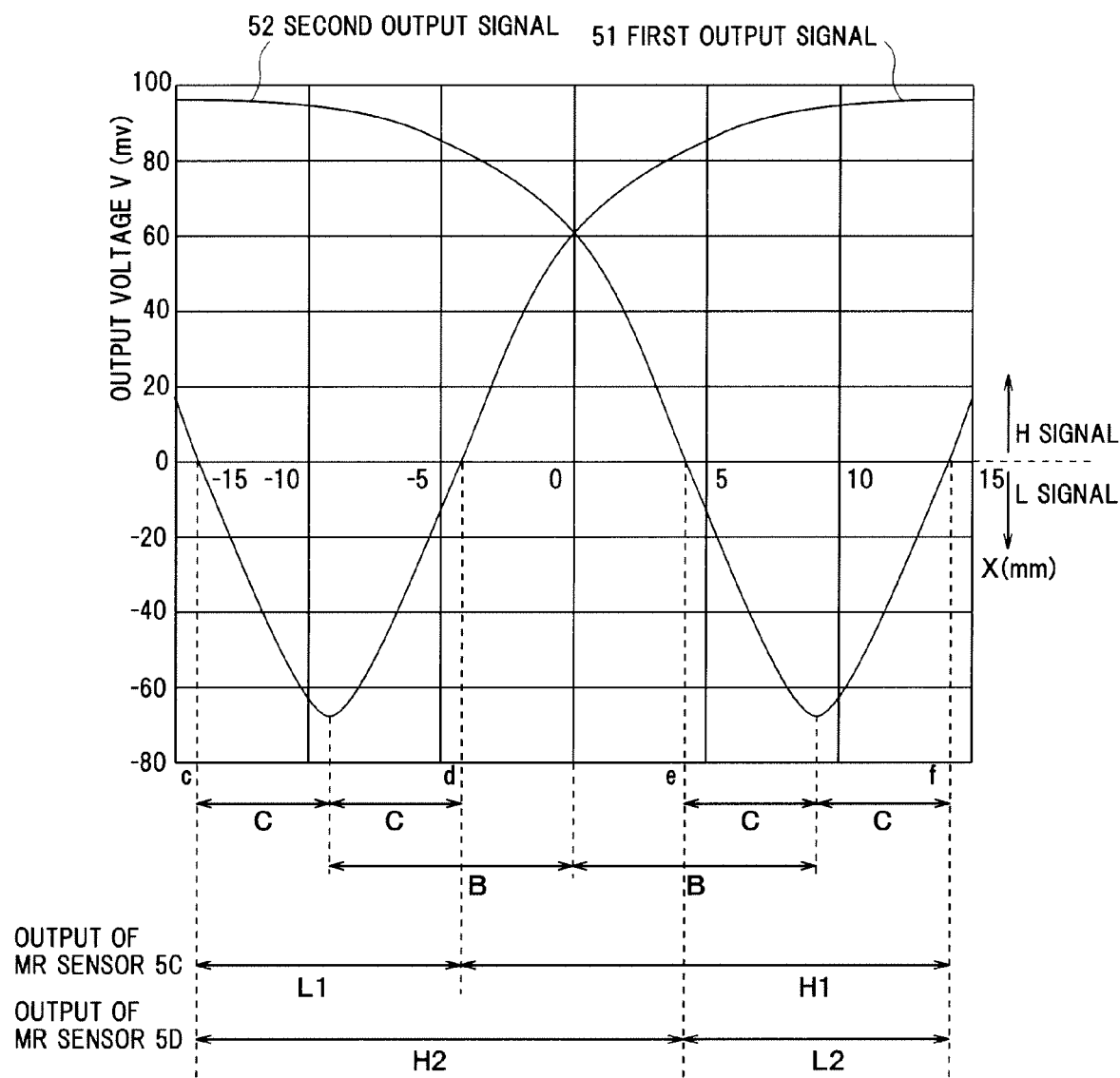
FIG. 12 is a graph showing a relation between calculated output voltage V and a position on an X-axis in the third embodiment of the invention.

FIG. 12 is a graph showing a relation between calculated output voltage V and a position on an X-axis in the third embodiment of the invention.

As shown in FIG. 12, the control portion 7 calculates a difference value based on the output voltage from the MR sensor 5C (a first output signal 51) and that based on the output voltage from the MR sensor 5D (a second output signal 52).

When the center of the magnet 3 is located at the distance B from the X-axis (a negative region of the X-axis), since the magnetic vector 61 acts on the magnetoresistance elements M1 to M4 from the above-mentioned direction shown in FIGS. 6A, 6B and 6C, the first output signal 51 has a negative minimum value.

In addition, when the center of the magnet 3 is located at the positions c and d, since the magnetic vector 61 acts on the magnetoresistance elements M1 to M4 at an angle of 45° as shown in the above-mentioned FIGS. 7, 8A, 8B and 8C, the first output signal 51 has a zero value.

When the center of the magnet 3 is located at the distance B from the X-axis (a positive region of the X-axis), since the magnetic vector 61 acts on the magnetoresistance elements M1 to M4 from the above-mentioned direction shown in FIGS. 6A, 6B and 6C, the second output signal 52 has a negative minimum value.

In addition, when the center of the magnet 3 is located at the positions e and f, since the magnetic vector 61 acts on the magnetoresistance elements M1 to M4 at an angle of 45° as shown in the above-mentioned FIGS. 7, 8A, 8B and 8C, the second output signal 52 has a zero value.

Therefore, as shown in FIG. 12, the control portion 7 judges as L1 when the output voltage V≦0 mv and as H1 when 0 mv<the output voltage V for the first output signal 51, and judges as L2 when the output voltage V≦0 mv and as H2 when 0 mv<the output voltage V for the second output signal 52.

As shown in FIG. 12, the control portion 7 can judge three operating positions based on the first output signal 51 and the second output signal 52. Namely, (in case of judgment based on the MR sensor 5C and that based on the MR sensor 5D) the control portion 7 can judge three operating positions based on three combinations of (L1, H2), (H1, H2) and (H1, L2).

In addition, as shown in FIG. 12, the switched position thereof is a position where the first output signal 51 and the second output signal 52 become zero, i.e., the first to fourth switched positions 23-26.

Therefore, the control portion 7 can accurately judge three operating positions and send a signal based on the three operating positions to the vehicle control portion 8, and the vehicle control portion 8 controls the controlled device 9 based on the signal received. In the switch device 1B, it is possible to easily change a distance between the switched positions by the distances B and C.

Effect of the Third Embodiment (1) According to the above-mentioned switch device 1B in the third embodiment, since the MR sensors 5C and 5D are provided, it is possible to have three operating positions, and it is thereby possible to easily set the switched positions thereof by the positions of the MR sensors 5C and 5D.

(2) According to the above-mentioned switch device 1B in the third embodiment, since it is possible to arrange the MR sensors 5C and 5D at a position on a line which forms an angle θ of 45° with the X-axis, it is possible to control a width in a Y-axis direction and it is thereby possible to downsize.

(3) According to the above-mentioned switch device 1B in the third embodiment, it is possible to easily change a distance between the switched portions by changing the distances B and C.

Similarly to the second embodiment, it is possible to obtain the same effect as that of the second embodiment by each providing an MR sensor at a position axisymmetric with respect to the X-axis.

Fourth Embodiment

Structure of Switch Device

Figure 13:
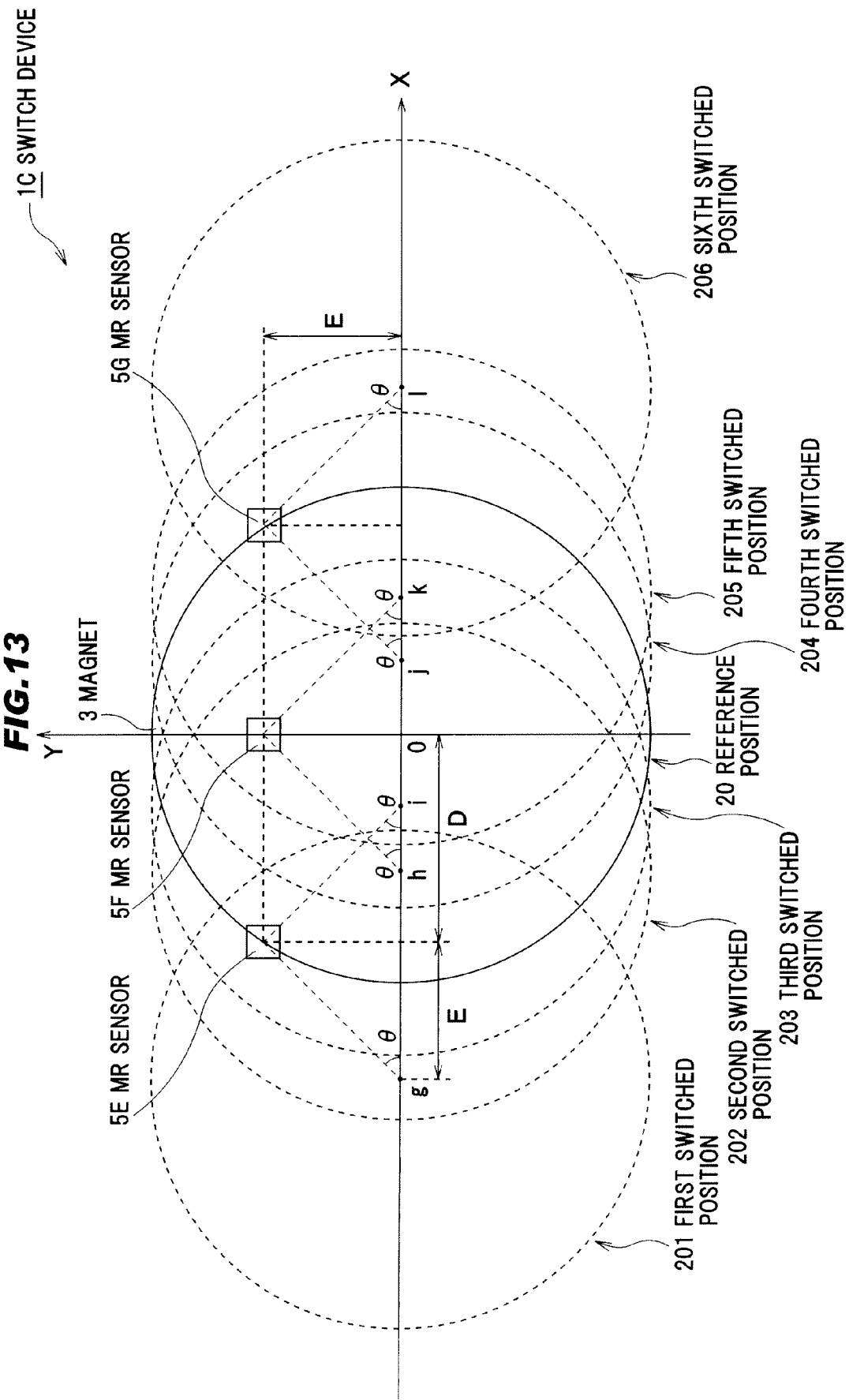
FIG. 13 is a schematic view showing a positional relation between a switched position and an MR sensor in a fourth embodiment of the invention.

FIG. 13 is a schematic view showing a positional relation between a switched position and an MR sensor in a fourth embodiment of the invention. As shown in FIG. 13, a switch device 1C in the present embodiment is provided with three magnetic sensors, which are MR sensors 5E to 5G, and also provided with first to sixth first switched positions 201 to 206.

The MR sensor 5E has the same structure as the MR sensor 5A in the first embodiment, and as shown in FIG. 13, the MR sensor 5E is arranged at a position separated a distance D from the Y-axis (a negative region of the X-axis) and a distance E from the X-axis (a positive region of the Y-axis). Distances from the origin to the positions g and l are the same, and distances from the origin to the positions i and j are the same.

The MR sensor 5F has the same structure as the MR sensor 5A in the first embodiment, and is arranged at a position separated a distance E from the X-axis in the same manner as the MR sensor 5E.

The MR sensor 5G is configured in the same manner as the MR sensors 5E and 5F, and as shown in FIG. 13, the MR sensor 5G is arranged at an axisymmetric position of the MR sensor 5E with respect to the Y-axis.

The MR sensors 5E to 5G output the output voltage to the control portion 7 and the control portion 7 calculates the above-mentioned difference value for each of the MR sensors 5E to 5G.

Motion in the Fourth Embodiment

Figure 14:
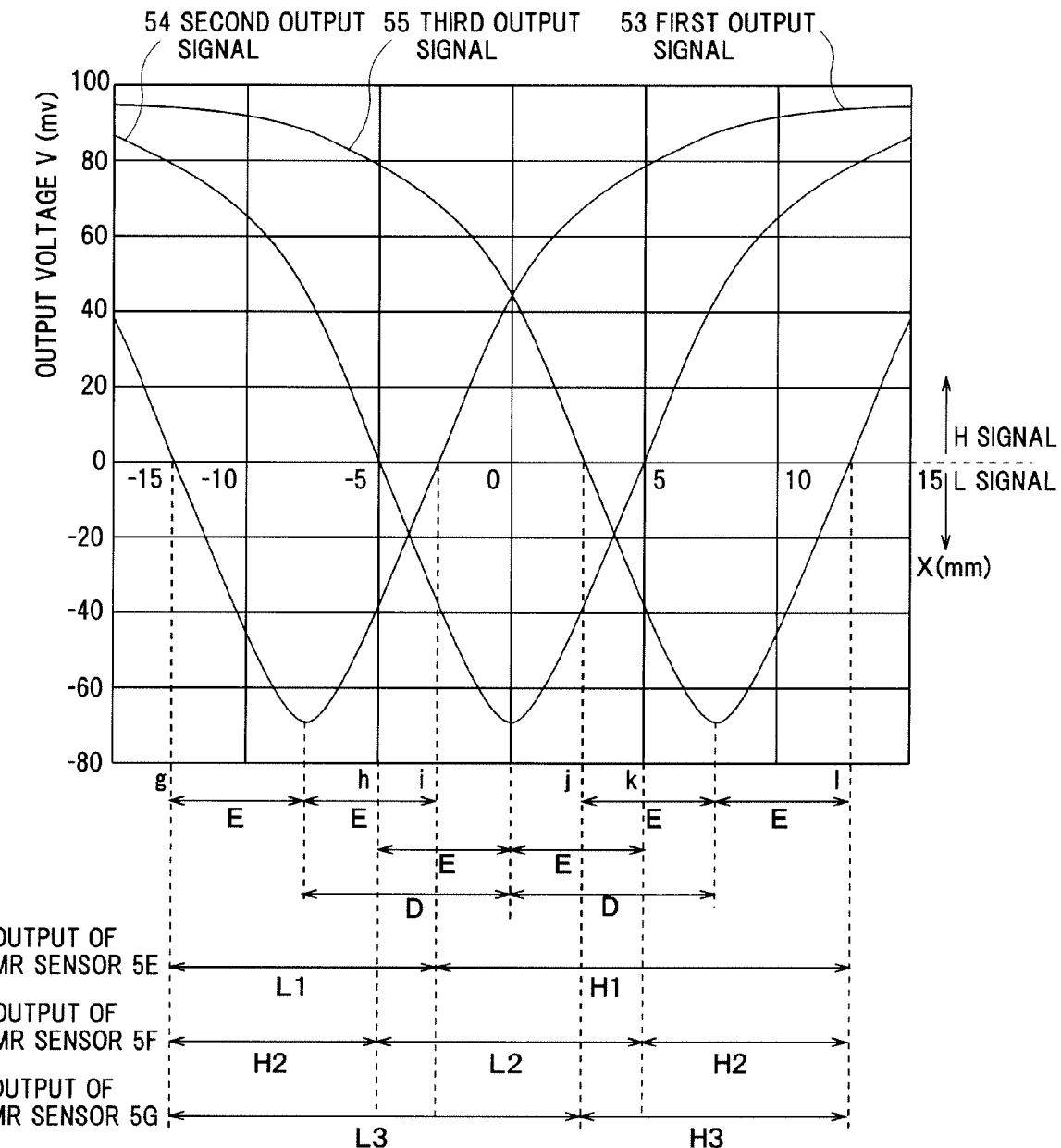
FIG. 14 is a graph showing a relation between calculated output voltage V and a position on an X-axis in the fourth embodiment of the invention.

FIG. 14 is a graph showing a relation between calculated output voltage V and a position on an X-axis in the fourth embodiment of the invention.

As shown in FIG. 14, the control portion 7 calculates a difference value based on the output voltage from the MR sensor 5E (a first output signal 53), that based on the output voltage from the MR sensor 5F (a second output signal 54), and that based on the output voltage from the MR sensor 5G (a third output signal 55).

When the center of the magnet 3 is located at the distance D from the X-axis (a negative region of the X-axis), since the magnetic vector 61 acts on the magnetoresistance elements M1 to M4 from the above-mentioned direction shown in FIGS. 6A, 6B and 6C, the first output signal 53 has a negative minimum value.

In addition, when the center of the magnet 3 is located at the positions g and i, since the magnetic vector 61 acts on the magnetoresistance elements M1*th* M4 at an angle of 45° as shown in the above-mentioned FIGS. 7, 8A, 8B and 8C, the first output signal 53 has a zero value.

When the center of the magnet 3 is located at the origin, since the magnetic vector 61 acts on the magnetoresistance elements M1 to M4 from the above-mentioned direction shown in FIGS. 6A, 6B and 6C, the second output signal 54 has a negative minimum value. In addition, when the center of the magnet 3 is located at the positions h and k, since the magnetic vector 61 acts on the magnetoresistance elements M1 to M4 at an angle of 45° as shown in the above-mentioned FIGS. 7, 8A, 8B and 8C, the second output signal 54 has a zero value.

When the center of the magnet 3 is located at the distance D from the X-axis (a positive region of the X-axis), since the magnetic vector 61 acts on the magnetoresistance elements M1 to M4 from the above-mentioned direction shown in FIGS. 6A, 6B and 6C, the third output signal 55 has a negative minimum value.

In addition, when the center of the magnet 3 is located at the positions j and l, since the magnetic vector 61 acts on the magnetoresistance elements M1 to M4 at an angle of 45° as shown in the above-mentioned FIGS. 7, 8A, 8B and 8C, the third output signal 55 has a zero value.

Therefore, as shown in FIG. 14, the control portion 7 judges as L1 when the output voltage V≦0 mv and as H1 when 0 mv<the output voltage V for the first output signal 53, judges as L2 when the output voltage V≦0 mv and as H2 when 0 mv<the output voltage V for the second output signal 54, and judges as L3 when the output voltage V≦0 mv and as H3 when 0 mv<the output voltage V for the third switched position 55.

As shown in FIG. 14, the control portion 7 can judge five operating positions based on the first to third output signals 53 to 55. Namely, (in case of judgment based on the MR sensor 5E, that based on the MR sensor 5F and that based on the MR sensor 5G) the control portion 7 can judge five operating positions based on five combinations of (L1, H2,H 3), (L1, L2, H3), (H1, L2, H3), (H1, L2, L3) and (H1, H2, L3).

In addition, as shown in FIG. 14, the switched position thereof is a position where the first to third output signals 53 to 55 become zero, i.e., first to sixth switched positions 201 to 206.

Therefore, the control portion 7 can accurately judge five operating positions and send a signal based on the five operating positions to the vehicle control portion 8, and the vehicle control portion 8 controls the controlled device 9 based on the signal received.

Effect of the Fourth Embodiment (1) According to the above-mentioned switch device 1C in the fourth embodiment, since the MR sensors 5E to 5G are provided, it is possible to have five operating positions, and it is thereby possible to easily set the switched positions thereof by the positions of the MR sensors 5E to 5G.

(2) According to the above-mentioned switch device 1C in the fourth embodiment, since it is possible to arrange the MR sensors 5E to 5G at a position on a line which forms an angle θ of 45° with the X-axis, it is possible to control a width in a Y-axis direction and it is thereby possible to downsize.

(3) According to the above-mentioned switch device 1C in the fourth embodiment, it is possible to easily change a distance between the switched portions by changing the distances D and E.

(4) Similarly to the second embodiment, it is possible to obtain the same effect as that of the second embodiment by each providing an MR sensor at a position axisymmetric with respect to the X-axis. In addition, as described above, in the switch device, it is possible to easily set the switched position even if the number of the MR sensors is increased. It should be noted that the present invention is not intended to be limited to the above-mentioned embodiments, and the various kinds of changes thereof can be implemented by those skilled in the art without departing from or without modifying the technical idea of the present invention.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A magnetic sensor device, comprising:
   an operating portion operable at an operating position on a single axis;
   a magnetic field generating means attached to the operating portion and configured to radially generate a magnetic field from a center thereof toward an outer periphery; and
   a first magnetic sensor comprising a bridge circuit comprised of a first magnetoresistance element and a second magnetoresistance element each having a magnetic sensing portion orthogonal to each other in a magnetic sensing direction thereof and a third magnetoresistance element and a fourth magnetoresistance element each having a magnetic sensing portion orthogonal to each other in a magnetic sensing direction thereof,
   wherein a first line is defined by projecting a trajectory of the center of the magnetic field generating means on a plane defined by the magnetic sensing portion,
   wherein the first magnetic sensor is disposed such that the magnetic sensing portion of the first to fourth magnetoresistance elements intersects at an angle of substantially 45 degrees with a second line intersecting with the first line at an angle of substantially 45 degrees, and an element center of the first to fourth magnetoresistance elements is on the second line.

2. The magnetic sensor device according to claim 1, wherein the operating position of the operating portion includes a reference position in a non-operated state thereof and a first switched position that a difference value between a midpoint potential between the first and second magnetoresistance elements and a midpoint potential between the third and fourth magnetoresistance elements changes in a sign thereof, and
   wherein a first switched point defined by projecting the center of the magnetic field generating means located at the first switched position on the first line corresponds to a first intersection point between the first line and the second line.

3. The magnetic sensor device according to claim 2, wherein at the first switched position, the first magnetic sensor is disposed such that the element center corresponds to a second intersection point between a third line passing through a reference point defined by projecting the center of the magnetic field generating means located at the reference position on the first line and orthogonal to the first line, and the second line.

4. The magnetic sensor device according to claim 3, wherein the operating position of the operating portion includes a second switched position that corresponds to a second switched point that is symmetrical to the first switched point with respect to the third line.

5. The magnetic sensor device according to claim 1, further comprising a second magnetic sensor that is disposed symmetrical to the first magnetic sensor with respect to the first line and operable to output a midpoint potential as the first magnetic sensor according to a position of the magnetic field generating means.

6. The magnetic sensor device according to claim 1, wherein the first magnetic sensor comprises a plurality of magnetic sensors, and
   wherein the magnetic sensor device further comprises a judgment portion for judging an operating position of the operating portion according to a combination of a sign of a difference value between midpoint potentials outputted from the plurality of magnetic sensors.

* * * * *